(12) United States Patent
Li et al.

(10) Patent No.: US 11,402,457 B2
(45) Date of Patent: Aug. 2, 2022

(54) SYSTEM AND METHOD FOR INTEGRATED TEST ON PRIMARY-SECONDARY POLE-MOUNTED BREAKER

(71) Applicants: ZHEJIANG HUADIAN EQUIPMENT TESTING INSTITUTE CO., LTD., Zhejiang (CN); STATE GRID ZHEJIANG HAIYAN COUNTY POWER SUPPLY CO., LTD., Zhejiang (CN); STATE GRID ZHEJIANG ELECTRIC POWER CO., LTD., Zhejiang (CN)

(72) Inventors: Zhi Li, Zhejiang (CN); Jingbo Hu, Zhejiang (CN); Zhiyao Zheng, Zhejiang (CN); Yibo Gao, Zhejiang (CN); Shaofeng Yu, Zhejiang (CN); Yifang Su, Zhejiang (CN); Gang Wu, Zhejiang (CN); Jianqin Lin, Zhejiang (CN); Hanpeng Yang, Zhejiang (CN); Weiliang Bian, Zhejiang (CN); Aimin Xu, Zhejiang (CN)

(73) Assignees: ZHEJIANG HUADIAN EQUIPMENT TESTING INSTITUTE CO., LTD., Zhejiang (CN); STATE GRID ZHEJIANG HAIYAN COUNTY POWER SUPPLY CO., LTD., Zhejiang (CN); STATE GRID ZHEJIANG ELECTRIC POWER CO., LTD., Zhejiang (CN)

( * ) Notice: Subject to any disclaimer, the term of this patent is extended or adjusted under 35 U.S.C. 154(b) by 165 days.

(21) Appl. No.: 16/897,130

(22) Filed: Jun. 9, 2020

(65) Prior Publication Data

US 2020/0386842 A1 Dec. 10, 2020

(30) Foreign Application Priority Data

Jun. 10, 2019 (CN) .......................... 201910496542.5
Jun. 10, 2019 (CN) .......................... 201910496993.9
Jul. 9, 2019 (CN) .......................... 201910615823.8

(51) Int. Cl.
*G01R 35/02* (2006.01)
*G01R 31/327* (2006.01)

(52) U.S. Cl.
CPC ......... *G01R 35/02* (2013.01); *G01R 31/3272* (2013.01); *G01R 31/3277* (2013.01)

(58) Field of Classification Search
CPC .............. G01R 31/327; G01R 31/3271; G01R 31/3272; G01R 31/3274; G01R 31/3277;
(Continued)

(56) References Cited

U.S. PATENT DOCUMENTS 6,960,916 B2 * 11/2005 Walker ................ G01R 31/3272
324/424
8,035,936 B2 * 10/2011 Erger ..................... H01H 83/04
361/42

(Continued)

FOREIGN PATENT DOCUMENTS

CN 108388236 A * 8/2018 ......... G05B 23/0213
CN 108535645 A * 9/2018 ......... G01R 31/3336
(Continued)

OTHER PUBLICATIONS

English Translation of Office Action of CN 201910496993 (Year: 2021).*

(Continued)

*Primary Examiner* — Jermele M Hollington
*Assistant Examiner* — Sean Curtis
(74) *Attorney, Agent, or Firm* — Yue (Robert) Xu (57) ABSTRACT

A system and a method for an integrated test on a primary-secondary pole-mounted breaker. The method includes:
(Continued)

establishing an electrical connection between the system and the primary-secondary pole-mounted breaker; establishing a communication connection between the system and the primary-secondary pole-mounted breaker; applying, by the system, a voltage signal and a current signal to the primary-secondary pole-mounted breaker through the electrical connection, to generate a voltage and a current on the primary-secondary pole-mounted breaker; collecting, by the system, signals of the voltage and the current fed back from the primary-secondary pole-mounted breaker through the communication connection; performing, by the system, an integrated accuracy test and an integrated protection test; outputting a test result of the accuracy test and a test result of the integrated protection test to the industrial control machine, to generate the test report. A blind zone in quality control of primary-secondary pole-mounted breakers is eliminated. Efficiency is improved in testing primary-secondary pole-mounted breakers.

18 Claims, 2 Drawing Sheets

(58) Field of Classification Search
CPC .............. G01R 31/3278; G01R 31/333; G01R 31/3336; G01R 35/02
USPC ........................................................ 324/424
See application file for complete search history.

(56) References Cited

U.S. PATENT DOCUMENTS

| | | | | |
|---|---|---|---|---|
| 2005/0110501 | A1* | 5/2005 | Walker | G01R 31/3272 |
| | | | | 324/536 |
| 2010/0123981 | A1* | 5/2010 | Erger | H01H 83/04 |
| | | | | 361/42 |
| 2018/0172767 | A1* | 6/2018 | Zhou | H01H 9/54 |
| 2020/0386842 | A1* | 12/2020 | Li | G01R 31/3277 |

FOREIGN PATENT DOCUMENTS

| | | | | | |
|---|---|---|---|---|---|
| CN | 109507459 | A | * | 3/2019 | |
| CN | 108535645 | B | * | 8/2019 | ......... G01R 31/3336 |
| CN | 110261764 | A | * | 9/2019 | ......... G01R 31/3272 |
| CN | 110286319 | A | * | 9/2019 | ......... G01R 31/3272 |
| CN | 110412454 | A | * | 11/2019 | ......... G01R 31/3272 |
| CN | 112379252 | A | * | 2/2021 | ........... G01R 31/327 |
| CN | 112526382 | A | * | 3/2021 | |
| CN | 112698579 | A | * | 4/2021 | |
| CN | 112379252 | B | * | 7/2021 | ........... G01R 31/327 |
| CN | 110286319 | B | * | 9/2021 | ......... G01R 31/3272 |
| CN | 110412454 | B | * | 9/2021 | ......... G01R 31/3272 |

OTHER PUBLICATIONS

English Translation of Office Action of CN 201910496542 (Year: 2021).*
English Translation of Office Action of CN 201910615823 (Year: 2021).*
English Translation of CN-109507459-A (Year: 2018).*

* cited by examiner

SYSTEM AND METHOD FOR INTEGRATED TEST ON PRIMARY-SECONDARY POLE-MOUNTED BREAKER

This application claims the priority to Chinese Patent Application No. 201910496542.5, titled "METHOD FOR INTEGRATED TEST ON PRIMARY-SECONDARY POLE-MOUNTED BREAKER", filed on Jun. 10, 2019 with the China National Intellectual Property Administration, Chinese Patent Application No. 201910496993.9, titled "METHOD FOR INTEGRATED TEST ON PRIMARY-SECONDARY POLE-MOUNTED BREAKER", filed on Jun. 10, 2019 with the China National Intellectual Property Administration, and Chinese Patent Application No. 201910615823.8, titled "METHOD FOR CLOSED-LOOP TEST ON PRIMARY-SECONDARY POLE-MOUNTED BREAKER", filed on Jul. 9, 2019 with the China National Intellectual Property Administration, the contents of which are incorporated herein by reference.

FIELD

The present disclosure relates to the technical field of power devices, and particularly, to a system and a method for an integrated test on a primary-secondary pole-mounted breaker.

BACKGROUND

Traditional pole-mounted breakers and distribution terminals in a power distribution network of a medium voltage (such as a 10 kV distribution network in a power system) are independently designed and manufactured, and independently tested and installed on-site by different manufacturers, resulting in a low matching degree and poor reliability. A large quantity of primary-secondary pole-mounted breakers is introduced into power grids with development of primary-secondary fusion technology in distribution devices. Integrated tests are necessary when assembling such devices with existing pole-mounted breakers, distribution terminals, transformers, primary connection cables, and secondary connection cables, so as to ensure completeness of functions and performances of the primary-secondary pole-mounted breakers. In conventional technology, methods for integrated tests on pole-mounted breakers are far from perfection, resulting in much work in testing the pole-mounted breakers. Hence, integrated accuracy tests and integrated protection tests are not fully utilized, resulting in a poor test effect.

Moreover, traditional pole-mounted breakers and distribution terminals are separately designed and installed, resulting in problems in interface standardization, device integration, equipment miniaturization, and test normalization, and further resulting in a low matching degree and poor reliability. No test method is proposed for controlling quality of the primary-secondary pole-mounted breakers, though a large quantity of primary-secondary pole-mounted breakers is introduced into power grids. Hence, there is a blind zone in quality control of the primary-secondary pole-mounted breakers.

In addition, as the primary-secondary pole-mounted breakers are introduced into power grids in a large scale, characteristics in a steady state and a transient state are difficult to be maintained for a primary side, a secondary side, and an integration of the two, in conventional tests with deficient in capabilities. Further, it is necessary to test the primary side, the secondary side, and the integration separately in the conventional tests, resulting in a bottleneck of low efficiency. Lacking a method for closed-loop test in quality control of the primary-secondary pole-mounted breakers results in no guarantee on penetration and a coverage rate of the primary-secondary pole-mounted breakers.

SUMMARY

An objective of the present disclosure is to provide a system and a method for an integrated test on a primary-secondary pole-mounted breaker. A technical issue of lacking an effective test means in conventional technology is effectively addressed, and a blind zone in quality control of primary-secondary pole-mounted breakers is eliminated, penetration and test efficiency are improved for primary-secondary pole-mounted breakers.

In order to address the above technical issues, a system for an integrated test on a primary-secondary pole-mounted breaker is provided according to embodiments of the present disclosure, including: an industrial control machine, a booster, a high-current generator, a standard voltage transformer, a standard current transformer, a standard transformer calibrator, and a standard electricity-meter calibrator.

The industrial control machine is configured to: set a preset parameter and a preset sequence of states; collect data from a standard transformer calibrator, a standard electricity-meter calibrator, and a distribution terminal of the primary-secondary pole-mounted breaker, and analyze the data to generate a test report.

The booster is configured to amplify a secondary voltage to acquire a primary voltage.

The high-current generator is configured to amplify a secondary current to acquire a primary current.

The standard voltage transformer is configured to convert the primary voltage into a voltage signal to facilitate measurement.

The standard current transformer is configured to convert the secondary current into a current signal to facilitate measurement.

The standard transformer calibrator includes a primary-side standard transformer calibrator. The primary-side standard transformer calibrator is configured to collect a voltage signal and a current signal that are outputted to a primary side of the primary-secondary pole-mounted breaker.

The standard electricity-meter calibrator is configured to collect a reference power signal, and calculate a power error based on a signal of electric power collected by the distribution terminal of the primary-secondary pole-mounted breaker.

A method for an integrated test on a primary-secondary pole-mounted breaker is further provided according to embodiments of the present disclosure. The method is applied to the aforementioned system, and includes following steps S1 to S4.

In step S1, an electrical connection is established between the system and the primary-secondary pole-mounted breaker.

In step S2, a communication connection is established between the system and the primary-secondary pole-mounted breaker.

In step S3, the system performs following operations. The system applies a voltage signal and a current signal to the primary-secondary pole-mounted breaker through the electrical connection, to generate a voltage and a current on the primary-secondary pole-mounted breaker. The system collects signals of the voltage and the current fed back from the primary-secondary pole-mounted breaker through the communication connection. The system performs an integrated accuracy test and an integrated protection test.

In step S4, a test result of the accuracy test and a test result of the integrated protection test are outputted to the industrial control machine, to generate the test report.

In one embodiment, the industrial control machine is further configured to pre-generate a state of a contact of a voltage regulator, and restore an open or closing state of the primary-secondary pole-mounted breaker, where the state of the contact of the voltage regulator corresponding to each sequence of states.

In one embodiment, the test system establishes the communication connection with a control terminal of primary-secondary pole-mounted breaker in the step S2 via a serial port or a network port.

In one embodiment, the primary-secondary pole-mounted breaker receives the voltage signal and the current signal via the control terminal.

In one embodiment, the step S3 includes following steps S31 and S32.

In step S31, the system performs following operations. The system applies the voltage signal and the current signal to the primary-secondary pole-mounted breaker through the electrical connection, to generate the voltage and the current on the primary-secondary pole-mounted breaker. The system collects the signals of the voltage and the current fed back from the primary-secondary pole-mounted breaker through the communication connection. The system performs the integrated accuracy test.

In step S32, the system performs following operations. The system applies a sequence of states for the current signal and a sequence of states for the voltage signal to the primary-secondary pole-mounted breaker through the electrical connection. The system collects a switch action of the primary-secondary pole-mounted breaker to the industrial control machine through the communication connection. The system performs the integrated protection test.

In one embodiment, the step S31 includes following steps A01 to A07, which may be in a sequence as listed.

In step A01, the industrial control machine presets a load point. A voltage-loop voltage regulator is controlled to output the secondary voltage via a contact of the voltage-loop voltage regulator. A current-loop voltage regulator is controlled to output the secondary current via a contact of the current-loop voltage regulator.

In step A02, the booster amplifies the secondary voltage to acquire a stable primary voltage. The high-current generator amplifies the secondary current to acquire the primary current. The industrial control machine collects a signal of the primary current through the standard current transformer and the primary-side standard transformer calibrator. The industrial control machine compares the signal of the primary current with the preset load point. The industrial control machine controls the current loop regulator to correct the secondary current, to obtain a stable primary current.

In step A03, the standard voltage transformer and the standard current transformer converts the primary stable voltage and the primary stable current applied to an input side of the primary-secondary pole-mounted breaker, into another secondary voltage and another secondary current.

In step A04, the standard electricity-meter calibrator collects first signals from the another secondary voltage and the another secondary current, and calculates electric power.

In step A05, the primary-side standard transformer calibrator collects second signals from the another secondary voltage and the another secondary current.

In step A06, the industrial control machine obtains through a communication interface, the first signals, a signal of an active power, and the signal of electric power, which are collected by the distribution terminal of the primary-secondary pole-mounted breaker.

In step A07, the industrial control machine obtains through the communication interface, the second signals collected by the primary-side standard transformer calibrator.

In one embodiment, the step S32 includes following steps B01 to B10, which may be in a sequence as listed.

In step B01, the industrial control machine ejects, through a communication interface, a protection plate of a control terminal of the primary-secondary pole-mounted breaker.

In step B02, the industrial control machine controls a contact of a current-loop voltage regulator to pre-output a sequence of states for the secondary current, based on the preset sequence of states.

In step B03, the high-current generator amplifies the secondary current to acquire the primary current. The industrial control machine collects a signal of the primary current through the standard current transformer and the primary-side standard transformer calibrator. The industrial control machine compares the primary current with a preset load point. The industrial control machine controls the current-loop regulator to correct the secondary current to obtain a stable primary current.

In step B04, the industrial control machine records a state of the contact of the current-loop voltage regulator corresponding to each state in the sequence of states for the secondary current.

In step B05, the industrial control machine injects, through the communication interface, the protection plate of the control terminal of primary-secondary pole-mounted breaker.

In step B06, the industrial control machine adjusts and outputs a sequence of states a secondary voltage and the sequence of states of a secondary current sequentially, according to the state of the contact of the current-loop voltage regulator corresponding to each state in the sequence of states for the secondary current.

In step B07, the booster amplifies the sequence of states for the secondary voltage to acquire a sequence of states for the primary voltage. The high-current generator amplifies the adjusted sequence of states for the secondary current to acquire a sequence of states for the primary current.

In step B08, the secondary voltage is amplified to acquire the primary voltage.

In step B09, the industrial control machine obtains, through the electrical interface, a first signal of opening or closing of the primary-secondary pole-mounted breaker.

In step B10, the industrial control machine obtains, through the communication interface, a second signal of opening or closing collected by the distribution terminal of the primary-secondary pole-mounted breaker. The industrial control machine controls a state of opening or closing of the primary-secondary pole-mounted breaker based on the second signal of opening or closing.

In one embodiment, the system further includes a first power source and a relay protection tester.

The first power source is configured to output the secondary voltage and the secondary current according to the preset parameter.

The relay protection tester is configured to output a sequence of states for the secondary voltage and a sequence of states for the secondary current according to the preset parameter.

In one embodiment corresponding to the above system, the step S31 includes following steps C01 to C10, which may be in a sequence as listed.

In step C01, the industrial control machine controls the first power source to output the secondary voltage and the secondary current based on a preset load point.

In step C02, a standard electricity-meter in the standard electricity-meter calibrator collects a signal of the secondary current outputted by the first power source.

In step C03, the primary-side standard transformer calibrator collects, through the standard current transformer, another signal of the second current outputted by the first power source.

In step C04, the booster amplifies the secondary voltage outputted by the first power source to acquire the primary voltage. The high-current generator amplifies the secondary current outputted by the first power source to acquire the primary current.

In step C05, the primary-side standard transformer calibrator collects, through the standard voltage transformer, a signal of the primary voltage outputted from the booster.

In step C06, the standard electricity-meter in the standard electricity-meter calibrator collects, through the standard voltage transformer, another signal of the primary voltage outputted from the booster.

In step C07, an error calculator in the standard electricity-meter calibrator obtains, through a communication interface, a signal of electric power collected by the standard electricity-meter, and the signal of electric power collected by the distribution terminal of the primary-secondary pole-mounted breaker. The error calculator calculates an error between the electric powers.

In step C08, the industrial control machine obtains, through the communication interface, the signal of the primary voltage and the another signal of the secondary current that are collected by the primary-side standard transformer calibrator.

In step C09, the industrial control machine obtains, through the communication interface, the error calculated by the standard electricity-meter calibrator.

In step C10, the industrial control machine obtains, through the communication interface, a voltage signal and a current signal that are collected by the distribution terminal of the primary and second pole-mounted breaker.

In one embodiment corresponding to the above system, step S32 includes following steps D01 to D06, which may be in a sequence as listed.

In step D01, the industrial control machine controls the relay protection tester to output the sequence of states for the secondary voltage and the sequence of states for the secondary current, based on the preset sequence of states.

In step D02, the primary-side standard transformer calibrator collects, through the standard current transformer, a signal of the second current outputted by the first power source.

In step D03, the booster amplifies the sequence of states for the secondary voltage outputted by the relay protection tester to acquire a sequence of states for the primary voltage.

The high-current generator amplifies the sequence of states for the secondary current outputted by the relay protection tester to acquire a sequence of states for the primary current.

In step D04, the primary-side standard transformer calibrator collects, through the standard voltage transformer, a signal of the primary voltage outputted from the booster.

In step D05, the industrial control machine obtains, through a communication interface, the signal of the primary voltage and the signal of the secondary current that are collected by the primary-side standard transformer calibrator.

In step D06, the industrial control machine obtains, through the communication interface, a telecommand signal collected by the distribution terminal of the primary and second pole-mounted breaker.

In one embodiment, the system further includes a high-voltage power source, a low-voltage power source, and a route-switching apparatus. The standard transformer calibrator further includes a secondary-side standard transformer calibrator.

The high-voltage power source is configured to output the secondary voltage and the secondary current according to the preset parameter.

The low-voltage power source is configured to output an electromagnetic terminal-voltage signal and an electromagnetic terminal-current signal, or output an electronic terminal-voltage signal and an electronic terminal-current signal, according to another preset parameter.

The secondary-side standard transformer calibrator is configured to collect a voltage signal and a current signal that are outputted to a secondary side of the primary-secondary pole-mounted breaker.

The route-switching apparatus is configured to switch a loop in the integrated test. The route-switching apparatus connects an output of the secondary side of the breaker to the primary-side standard transformer calibrator, in case of a test on the primary side. The route-switching apparatus connects the low-voltage power source to the distribution terminal of the primary-secondary pole-mounted breaker, in case of a test on the secondary side. The route-switching apparatus directly connects an output of the secondary side of the breaker to an input of the distribution terminal of the primary-secondary pole-mounted breaker, in case of a test on an integration of the primary side and the secondary side.

In one embodiment, the route-switching apparatus is connected to the industrial control machine.

In one embodiment corresponding to the above system, the step S1 includes following steps.

A first electrical connection is established between the system and the primary-secondary pole-mounted breaker. A second electrical connection is established between the route-switching apparatus of the system and the output of the secondary side of the primary-secondary pole-mounted breaker. A third electrical connection is established between the route-switching apparatus of the system and the distribution terminal of the primary-secondary pole-mounted breaker.

In one embodiment, the voltage signal and the current signal applied to the primary-secondary pole-mounted breaker are stable. The integrated accuracy test and the integrated protection test include an accuracy test on the primary side, the second side, and the integration of the primary side and the second side. The step 3 includes followings steps. The route-switching apparatus connects the output of the secondary side of the breaker to the primary-side standard transformer calibrator, in case of the test on the primary side. The route-switching apparatus connects the low-voltage power source to the distribution terminal of the primary-secondary pole-mounted breaker, in case of the test on the secondary side. The route-switching apparatus connects the output of the secondary side of the breaker directly to the input of the distribution terminal of the primary-secondary pole-mounted breaker, in case of the test on the integration of the primary side and the secondary side.

In one embodiment corresponding to the above system, the step S3 includes following steps E01 to E22, which may be in a sequence as listed.

In step E01, the industrial control machine establishes, through the route-switching apparatus, an electrical connection between the secondary side of the primary-secondary pole-mounted breaker and the primary-side standard transformer calibrator.

In step E02, the industrial control machine controls the high-voltage power source to output the secondary voltage and the secondary current simultaneously, based on a preset load point.

In step E03, the booster amplifies the secondary voltage outputted by the high-voltage power source to acquire the primary voltage, and the high-current generator amplifies the secondary current outputted by the high-voltage power source to acquire the primary current.

In step E04, the primary-side standard transformer calibrator collects, through the standard voltage transformer, a signal of the primary voltage outputted by the booster. The primary-side standard transformer calibrator collects, through the standard current transformer, a signal of the primary current outputted by the high-current generator.

In step E05, the primary-side standard transformer calibrator collects signals of the secondary current and the secondary voltage that are outputted by the breaker.

In step E06, the primary-side standard transformer calibrator calculates an error based on the collected signals, and sends the error as a result to the industrial control machine, to complete the accuracy test on the primary side.

In step E07, the industrial control machine establishes an electrical connection among the low-voltage power source, and the secondary-side standard transformer calibrator, and the distribution terminal of the primary-secondary pole-mounted breaker.

In step E08, the industrial control machine controls the low-voltage power source to output the secondary voltage and the secondary current simultaneously, based on the preset load point.

In step E09, the secondary-side standard transformer calibrator collects first signals of the secondary current and the secondary voltage outputted by the low-voltage power source, and sends the collected first signals of the secondary current and the secondary voltage to the industrial control machine.

In step E10, the standard electricity-meter calibrator collects second signals of the secondary current signal and the secondary voltage signal outputted by the low-voltage programmable source, and sends another signal of electric power to the industrial control machine.

In step E11, the industrial control machine collects, through a communication interface to the distribution terminal of the primary-secondary pole-mounted breaker, a current signal, a voltage signal and the signal of electric power that are collected by the distribution terminal. The industrial control machine compares the current signal, the voltage signal and the signal of the electric power that are collected by the distribution terminal, with the first signals sent by the secondary-side standard transformer calibrator and the another signal of electric power sent by the standard electricity-meter calibrator, to calculate an error and complete the accuracy test on the secondary side.

In step E12, the industrial control machine controls the low-voltage power source to output the secondary signal and the secondary current simultaneously, based on a preset waveform.

In step E13, the industrial control machine collects, through the communication interface, a telecommand signal outputted by the distribution terminal of the primary-secondary pole-mounted breaker, to complete a transmission test on the secondary side.

In step E14, the industrial computer establishes, through the route-switching apparatus, an electrical connection between the primary-secondary pole-mounted breaker and the distribution terminal of the primary-secondary pole-mounted breaker.

In step E15, the industrial control machine controls the high-voltage power source to output the secondary voltage and the secondary current simultaneously, based on another preset load point.

In step E16, the booster amplifies the secondary voltage outputted by the high-voltage power source to acquire the primary voltage, and the high-current generator amplifies the secondary current outputted by the high-voltage power source to acquire the primary current.

In step E17, the primary-side standard transformer calibrator collects, through the standard voltage transformer, a signal of the primary voltage outputted by the booster. The primary-side standard transformer calibrator collects, through the standard current transformer, a signal the primary current outputted by the high-current generator. The primary-side standard transformer calibrator sends the signals of the primary voltage and the primary current to the industrial control machine.

In step E18, the industrial control machine collects, through the communication interface, the current signal and the voltage signal collected by the distribution terminal of the primary-secondary pole-mounted breaker, and calculates an error to complete the accuracy test on the integration.

In step E19, the industrial control machine controls the high-voltage power source to output the secondary voltage and the secondary current simultaneously, based on the preset waveform.

In step E20, the booster amplifies the secondary voltage outputted by the high-voltage power source to acquire the primary voltage, and the high-current generator amplifies the secondary current outputted by the high-voltage power source to acquire the primary current signal.

In step E21, The industrial computer collects, through the communication interface, the telecommand signal outputted by the distribution terminal, to complete a transmission test on the integration.

In step E22, the industrial control machine outputs the test report according to a result of the accuracy tests and the transmission tests, to complete a closed-loop test.

In view of above, technical solutions of the present disclosure have at least following advantages.

(1) The electrical connection is established between the test system and the input side of the breaker, and the communication connection is established between the test system and the control terminal of the breaker. Thereby, it is convenient for the test system to perform the integrated accuracy test and the integrated protection test.

(2) Results of the accuracy test and the integrated protection test are analyzed, signals are inputted and collected in the integrated test on the primary-secondary pole-mounted breaker, and actions of opening and closing are automatically performed during the test. The integrated test of the primary-secondary pole-mounted breaker can be automatically performed. The integrated accuracy test and the integrated protection test are achieved on the primary-secondary pole-mounted breaker, or on an integration of the primary-secondary pole-mounted breaker, the distribution terminal, transformers, and primary-secondary connection cables.

(3) A blind zone in quality control of the primary-secondary pole-mounted breakers is effectively eliminated, providing a good coverage of the primary-secondary pole-mounted breakers. The test system can perform integrated accuracy and protection tests on voltage, current, and electric power of the primary-secondary pole-mounted breaker. The test system can reset opening and closing of the breaker automatically in the integrated tests, and the automatic operation saves manpower and improves test efficiency.

(4) The primary-side standard transformer calibrator is capable to collect 16 channels simultaneously, and the secondary-side standard transformer calibrator is capable to collect 8 channels simultaneously. Thereby, the accuracy test can be completed at once on all channels, which is time-saving and ensures similarity between a test condition and a practical condition. In addition, the route-switching apparatus can be switched among tests on the primary side, the secondary side, and the integration of the primary side and the secondary side. The closed-loop test on the primary side, the secondary side and the integration can be without changing wire connections, which improves a degree of automation.

DETAILED DESCRIPTION

Figure 1:
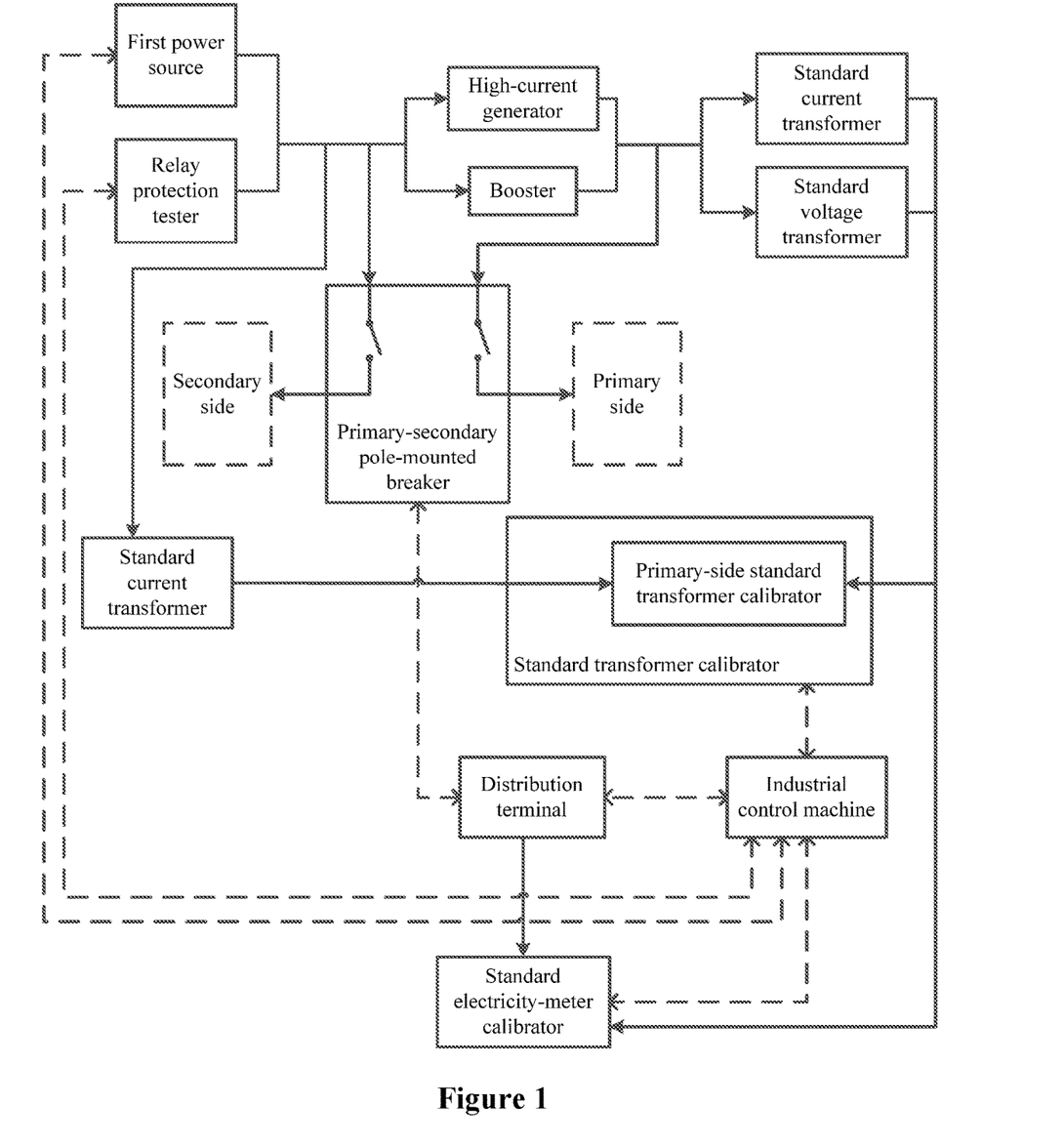
FIG. 1 is a schematic structural diagram of a system for an integrated test on a primary-secondary pole-mounted breaker.

A system for an integrated test on a primary-secondary pole-mounted breaker is provided according to embodiments of the present disclosure, including: an industrial control machine, a booster, a high-current generator, a standard voltage transformer, a standard current transformer, a standard transformer calibrator, and a standard electricity-meter calibrator. Reference is made to FIG. 1, in which solid arrows indicate electric links such as transmitting voltage and current, and dashed arrows indicate control links for data collection and/or transmitting control signals.

The industrial control machine is configured to: set a preset parameter and a preset sequence of states; collect data from a standard transformer calibrator, a standard electricity-meter calibrator, and a distribution terminal of the primary-secondary pole-mounted breaker, and analyze the data to generate a test report.

The booster is configured to amplify a secondary voltage to acquire a primary voltage.

The high-current generator is configured to amplify a secondary current to acquire a primary current.

The standard voltage transformer is configured to convert the primary voltage into a voltage signal to facilitate measurement.

The standard current transformer is configured to convert the secondary current into a current signal to facilitate measurement. In order to facilitate illustration, the standard current transformer is depicted as two separate blocks in FIG. 1, while there may be only one standard current transformer in practice.

The standard transformer calibrator includes a primary-side standard transformer calibrator. The primary-side standard transformer calibrator is configured to collect a voltage signal and a current signal that are outputted to a primary side of the primary-secondary pole-mounted breaker.

The standard electricity-meter calibrator is configured to collect a reference power signal, and calculate a power error based on a signal of electric power collected by the distribution terminal of the primary-secondary pole-mounted breaker.

In one embodiment, the industrial control machine is further configured to pre-generate a state of a contact of a voltage regulator, and restore an open or closing state of the primary-secondary pole-mounted breaker, where the state of the contact of the voltage regulator corresponding to each sequence of states.

A method for an integrated test on a primary-secondary pole-mounted breaker is further provided according to embodiments of the present disclosure. The method is applied to the aforementioned system, and includes following steps S1 to S4.

In step S1, an electrical connection is established between the system and the primary-secondary pole-mounted breaker.

In step S2, a communication connection is established between the system and the primary-secondary pole-mounted breaker.

In step S3, the system performs following operations. The system applies a voltage signal and a current signal to the primary-secondary pole-mounted breaker through the electrical connection, to generate a voltage and a current on the primary-secondary pole-mounted breaker. The system collects signals of the voltage and the current fed back from the primary-secondary pole-mounted breaker through the communication connection. The system performs an integrated accuracy test and an integrated protection test.

In step S4, a test result of the accuracy test and a test result of the integrated protection test are outputted to the industrial control machine, to generate the test report.

In one embodiment, the primary-secondary pole-mounted breaker receives the voltage signal and the current signal via a control terminal.

The electrical connection is established between the test system and the input side of the breaker, and the communication connection is established between the test system and the control terminal of the breaker. Thereby, it is convenient for the test system to perform the integrated accuracy test and the integrated protection test, results of the accuracy test and the integrated protection test are analyzed, signals are inputted and collected in the integrated test on the primary-secondary pole-mounted breaker, and actions of opening and closing are automatically performed during the test. The integrated test of the primary-secondary pole-mounted breaker can be automatically performed. The integrated accuracy test and the integrated protection test are achieved on the primary-secondary pole-mounted breaker, providing a good coverage of the primary-secondary pole-mounted breaker. The test system can reset opening and closing of the breaker automatically in the integrated tests, and the automatic operation saves manpower and improves test efficiency.

In the step S2, the test system establishes the communication connection with a control terminal of primary-secondary pole-mounted breaker a serial port. The serial port is quite stable in communication, which reduces costs in long-distance communication. Alternatively, the test system establishes the communication connection with a control terminal of the primary-secondary pole-mounted breaker via a network port.

The step S3 may include steps S31 and S32.

In step S31, the system performs following operations. The system applies the voltage signal and the current signal to the primary-secondary pole-mounted breaker through the electrical connection, to generate the voltage and the current on the primary-secondary pole-mounted breaker. The system collects the signals of the voltage and the current fed back from the primary-secondary pole-mounted breaker through the communication connection. The system performs the integrated accuracy test.

In step S32, the system performs following operations. The system applies a sequence of states for the current signal and a sequence of states for the voltage signal to the primary-secondary pole-mounted breaker through the electrical connection. The system collects a switch action of the primary-secondary pole-mounted breaker to the industrial control machine through the communication connection. The system performs the integrated protection test.

The step S31 may include following steps A01 to A07. The steps A01 to A07 may be in a sequence listed as follows.

In step A01, the industrial control machine presets a load point. A voltage-loop voltage regulator is controlled to output the secondary voltage via a contact of the voltage-loop voltage regulator. A current-loop voltage regulator is controlled to output the secondary current via a contact of the current-loop voltage regulator.

In step A02, the booster amplifies the secondary voltage to acquire a stable primary voltage. The high-current generator amplifies the secondary current to acquire the primary current. The industrial control machine collects a signal of the primary current through the standard current transformer and the primary-side standard transformer calibrator. The industrial control machine compares the signal of the primary current with the preset load point. The industrial control machine controls the current loop regulator to correct the secondary current, to obtain a stable primary current.

In step A03, the standard voltage transformer and the standard current transformer converts the primary stable voltage and the primary stable current applied to an input side of the primary-secondary pole-mounted breaker, into another secondary voltage and another secondary current.

In step A04, the standard electricity-meter calibrator collects first signals from the another secondary voltage and the another secondary current, and calculates electric power.

In step A05, the primary-side standard transformer calibrator collects second signals from the another secondary voltage and the another secondary current.

In step A06, the industrial control machine obtains through a communication interface, the first signals, a signal of an active power, and the signal of electric power, which are collected by the distribution terminal of the primary-secondary pole-mounted breaker.

In step A07, the industrial control machine obtains through the communication interface, the second signals collected by the primary-side standard transformer calibrator.

The step S32 may include the following steps B01 to B10. The steps B01 to B10 may be in a sequence listed as follows.

In step B01, the industrial control machine ejects, through a communication interface, a protection plate of a control terminal of the primary-secondary pole-mounted breaker.

In step B02, the industrial control machine controls a contact of a current-loop voltage regulator to pre-output a sequence of states for the secondary current, based on the preset sequence of states.

In step B03, the high-current generator amplifies the secondary current to acquire the primary current. The industrial control machine collects a signal of the primary current through the standard current transformer and the primary-side standard transformer calibrator. The industrial control machine compares the primary current with a preset load point. The industrial control machine controls the current-loop regulator to correct the secondary current to obtain a stable primary current.

In step B04, the industrial control machine records a state of the contact of the current-loop voltage regulator corresponding to each state in the sequence of states for the secondary current.

In step B05, the industrial control machine injects, through the communication interface, the protection plate of the control terminal of primary-secondary pole-mounted breaker.

In step B06, the industrial control machine adjusts and outputs a sequence of states a secondary voltage and the sequence of states of a secondary current sequentially, according to the state of the contact of the current-loop voltage regulator corresponding to each state in the sequence of states for the secondary current.

In step B07, the booster amplifies the sequence of states for the secondary voltage to acquire a sequence of states for the primary voltage. The high-current generator amplifies the adjusted sequence of states for the secondary current to acquire a sequence of states for the primary current.

In step B08, the secondary voltage is amplified to acquire the primary voltage.

In step B09, the industrial control machine obtains, through the electrical interface, a first signal of opening or closing of the primary-secondary pole-mounted breaker.

In step B10, the industrial control machine obtains, through the communication interface, a second signal of opening or closing collected by the distribution terminal of the primary-secondary pole-mounted breaker. The industrial control machine controls a state of opening or closing of the primary-secondary pole-mounted breaker based on the second signal of opening or closing.

Reference is further made to FIG. 1. In one embodiment, the system further includes a first power source and a relay protection tester.

The first power source is configured to output the secondary voltage and the secondary current according to the preset parameter.

The relay protection tester is configured to output a sequence of states for the secondary voltage and a sequence of states for the secondary current according to the preset parameter.

In the above embodiment, the electrical connection is established in the step S1 and the communication connection is established in the step S2. On such basis, the integrated accuracy test and the integrated protection test can be performed in the step S3. The test system can achieve input and collection of signals in the integrated test on the primary-secondary pole-mounted breaker, and analyzes the inputted signal and collected signal. Thereby, the integrated test on the primary-secondary pole-mounted breaker is realized, and the integrated accuracy test and the integrated protection test on an integration of the pole-mounted breaker, the distribution terminal, transformers and primary-secondary connection cables are realized, providing a good coverage of the primary-secondary pole-mounted breakers. A blind zone in quality control of the primary-secondary pole-mounted breakers is effectively eliminated. The test system can perform integrated accuracy and protection tests on voltage, current, and electric power of the primary-secondary pole-mounted breaker with a high degree of automation, which saves manpower and improves test efficiency.

In the step S2, the test system may establish the communication connection with the control terminal of the primary-secondary pole-mounted breaker via the serial port or the network port, which can adapt to different working environments and installation requirements with good performance in practice. In one embodiment, a current transfer ratio of the high-current generator is 1:10, a rated capacity of the high-current generator is 2000 VA, and a precision of the high-current generator is in a level of 0.01 S. A precision of the standard transformer calibrator is in a level of 0.05 for current and voltage. An error of the standard energy meter calibrator is within ±0.5% for in measurement of three-phase voltage, current, and power. A range of voltage measurement range is from 10V to 500V. A range of current measurement range is from 10 mA to 120 A.

In one embodiment, the step S31 may include following steps C01 to C10. The steps C01 to C10 may in a sequence listed as follows.

In step C01, the industrial control machine controls the first power source to output the secondary voltage and the secondary current based on a preset load point.

In step C02, a standard electricity-meter in the standard electricity-meter calibrator collects a signal of the secondary current outputted by the first power source.

In step C03, the primary-side standard transformer calibrator collects, through the standard current transformer, another signal of the second current outputted by the first power source.

In step C04, the booster amplifies the secondary voltage outputted by the first power source to acquire the primary voltage. The high-current generator amplifies the secondary current outputted by the first power source to acquire the primary current.

In step C05, the primary-side standard transformer calibrator collects, through the standard voltage transformer, a signal of the primary voltage outputted from the booster.

In step C06, the standard electricity-meter in the standard electricity-meter calibrator collects, through the standard voltage transformer, another signal of the primary voltage outputted from the booster.

In step C07, an error calculator in the standard electricity-meter calibrator obtains, through a communication interface, a signal of electric power collected by the standard electricity-meter, and the signal of electric power collected by the distribution terminal of the primary-secondary pole-mounted breaker. The error calculator calculates an error between the electric powers.

In step C08, the industrial control machine obtains, through the communication interface, the signal of the primary voltage and the another signal of the secondary current that are collected by the primary-side standard transformer calibrator.

In step C09, the industrial control machine obtains, through the communication interface, the error calculated by the standard electricity-meter calibrator.

In step C10, the industrial control machine obtains, through the communication interface, a voltage signal and a current signal that are collected by the distribution terminal of the primary and second pole-mounted breaker.

In one embodiment, the step S32 may include following steps D01 to D06. The steps D01 to D06 may be in a sequence listed as follows.

In step D01, the industrial control machine controls the relay protection tester to output the sequence of states for the secondary voltage and the sequence of states for the secondary current, based on the preset sequence of states.

In step D02, the primary-side standard transformer calibrator collects, through the standard current transformer, a signal of the second current outputted by the first power source.

In step D03, the booster amplifies the sequence of states for the secondary voltage outputted by the relay protection tester to acquire a sequence of states for the primary voltage. The high-current generator amplifies the sequence of states for the secondary current outputted by the relay protection tester to acquire a sequence of states for the primary current.

In step D04, the primary-side standard transformer calibrator collects, through the standard voltage transformer, a signal of the primary voltage outputted from the booster.

In step D05, the industrial control machine obtains, through a communication interface, the signal of the primary voltage and the signal of the secondary current that are collected by the primary-side standard transformer calibrator.

In step D06, the industrial control machine obtains, through the communication interface, a telecommand signal collected by the distribution terminal of the primary and second pole-mounted breaker.

Figure 2:
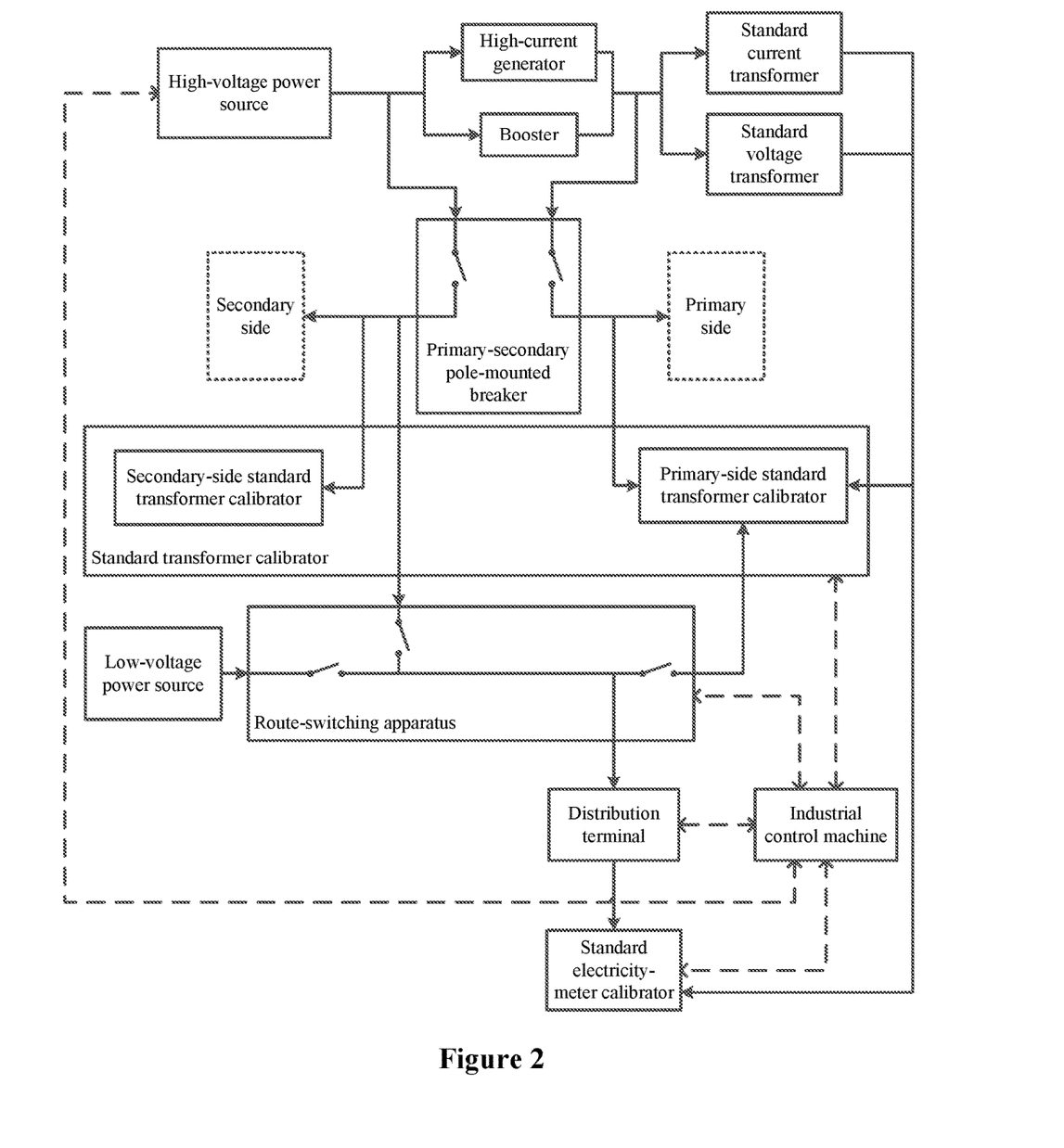
FIG. 2 is another schematic structural diagram of a system for an integrated test on a primary-secondary pole-mounted breaker.

Reference is made to FIG. 2, in which solid arrows indicate electric links such as transmitting voltage and current, and dashed arrows indicate control links for data collection and/or transmitting control signals. In one embodiment, the system further includes a high-voltage power source, a low-voltage power source, and a route-switching apparatus, and the standard transformer calibrator further includes a secondary-side standard transformer calibrator. Accordingly, a closed-loop test on the primary side, the secondary side and an integration of the two can be achieved.

The high-voltage power source is configured to output the secondary voltage and the secondary current according to the preset parameter.

The low-voltage power source is configured to output an electromagnetic terminal-voltage signal and an electromagnetic terminal-current signal, or output an electronic terminal-voltage signal and an electronic terminal-current signal, according to another preset parameter.

The secondary-side standard transformer calibrator is configured to collect a voltage signal and a current signal that are outputted to a secondary side of the primary-secondary pole-mounted breaker.

The route-switching apparatus is configured to switch a loop in the integrated test. The route-switching apparatus connects an output of the secondary side of the breaker to the primary-side standard transformer calibrator, in case of a test on the primary side. The route-switching apparatus connects the low-voltage power source to the distribution terminal of the primary-secondary pole-mounted breaker, in case of a test on the secondary side. The route-switching apparatus directly connects an output of the secondary side of the breaker to an input of the distribution terminal of the primary-secondary pole-mounted breaker, in case of a test on an integration of the primary side and the secondary side.

In one embodiment, the route-switching apparatus is connected to the industrial control machine.

In one embodiment corresponding to the above system, the step S1 includes following steps. A first electrical connection is established between the system and the primary-secondary pole-mounted breaker. A second electrical connection is established between the route-switching apparatus of the system and the output of the secondary side of the primary-secondary pole-mounted breaker. A third electrical connection is established between the route-switching apparatus of the system and the distribution terminal of the primary-secondary pole-mounted breaker.

In one embodiment, the voltage signal and the current signal applied to the primary-secondary pole-mounted breaker are stable. The integrated accuracy test and the integrated protection test include an accuracy test on the primary side, the second side, and the integration of the primary side and the second side.

Corresponding to this embodiment, the step 3 includes followings steps. The route-switching apparatus connects the output of the secondary side of the breaker to the primary-side standard transformer calibrator, in case of the test on the primary side. The route-switching apparatus connects the low-voltage power source to the distribution terminal of the primary-secondary pole-mounted breaker, in case of the test on the secondary side. The route-switching apparatus connects the output of the secondary side of the breaker directly to the input of the distribution terminal of the primary-secondary pole-mounted breaker, in case of the test on the integration of the primary side and the secondary side.

The electrical connection is established in the step S1, the communication connection is established in the step S2, the accuracy tests and the protection tests are performed in the step S3 on the primary side test, the secondary side test and the integration of the two, and the test report is generated in the step S4 in the test method. The primary-side standard transformer calibrator is capable to collect 16 channels simultaneously, and the secondary-side standard transformer calibrator is capable to collect 8 channels simultaneously. Thereby, the accuracy test can be completed at once on all channels, which is timesaving and ensures similarity between a test condition and a practical condition. In addition, the route-switching apparatus can be switched among tests on the primary side, the secondary side, and the integration of the primary side and the secondary side. The closed-loop test on the primary side, the secondary side and the integration can be without changing wire connections. A degree of automation is high, improving test efficiency.

In the step S2, the test system establishes the communication connection with the control terminal of the primary-secondary pole-mounted breaker via the serial port or the network port, which can adapt to different working environments and installation requirements with a good performance in performance. The route-switching apparatus is connected to the industrial control machine, achieving precise control of the route-switching apparatus, which is convenient for an operator.

In one embodiment, the step S33 may include following steps E01 to E22. The steps E01 to E22 may be in a sequence listed as follows.

In step E01, the industrial control machine establishes, through the route-switching apparatus, an electrical connection between the secondary side of the primary-secondary pole-mounted breaker and the primary-side standard transformer calibrator.

In step E02, the industrial control machine controls the high-voltage power source to output the secondary voltage and the secondary current simultaneously, based on a preset load point.

In step E03, the booster amplifies the secondary voltage outputted by the high-voltage power source to acquire the primary voltage, and the high-current generator amplifies the secondary current outputted by the high-voltage power source to acquire the primary current.

In step E04, the primary-side standard transformer calibrator collects, through the standard voltage transformer, a signal of the primary voltage outputted by the booster. The primary-side standard transformer calibrator collects, through the standard current transformer, a signal of the primary current outputted by the high-current generator.

In step E05, the primary-side standard transformer calibrator collects signals of the secondary current and the secondary voltage that are outputted by the breaker.

In step E06, the primary-side standard transformer calibrator calculates an error based on the collected signals, and sends the error as a result to the industrial control machine, to complete the accuracy test on the primary side.

In step E07, the industrial control machine establishes an electrical connection among the low-voltage power source, and the secondary-side standard transformer calibrator, and the distribution terminal of the primary-secondary pole-mounted breaker.

In step E08, the industrial control machine controls the low-voltage power source to output the secondary voltage and the secondary current simultaneously, based on the preset load point.

In step E09, the secondary-side standard transformer calibrator collects first signals of the secondary current and the secondary voltage outputted by the low-voltage power source, and sends the collected first signals of the secondary current and the secondary voltage to the industrial control machine.

In step E10, the standard electricity-meter calibrator collects second signals of the secondary current signal and the secondary voltage signal outputted by the low-voltage programmable source, and sends another signal of electric power to the industrial control machine.

In step E11, the industrial control machine collects, through a communication interface to the distribution terminal of the primary-secondary pole-mounted breaker, a current signal, a voltage signal and the signal of electric power that are collected by the distribution terminal. The industrial control machine compares the current signal, the voltage signal and the signal of the electric power that are collected by the distribution terminal, with the first signals sent by the secondary-side standard transformer calibrator and the another signal of electric power sent by the standard electricity-meter calibrator, to calculate an error and complete the accuracy test on the secondary side.

In step E12, the industrial control machine controls the low-voltage power source to output the secondary signal and the secondary current simultaneously, based on a preset waveform.

In step E13, the industrial control machine collects, through the communication interface, a telecommand signal outputted by the distribution terminal of the primary-secondary pole-mounted breaker, to complete a transmission test on the secondary side.

In step E14, the industrial computer establishes, through the route-switching apparatus, an electrical connection between the primary-secondary pole-mounted breaker and the distribution terminal of the primary-secondary pole-mounted breaker.

In step E15, the industrial control machine controls the high-voltage power source to output the secondary voltage and the secondary current simultaneously, based on another preset load point.

In step E16, the booster amplifies the secondary voltage outputted by the high-voltage power source to acquire the primary voltage, and the high-current generator amplifies the secondary current outputted by the high-voltage power source to acquire the primary current.

In step E17, the primary-side standard transformer calibrator collects, through the standard voltage transformer, a signal of the primary voltage outputted by the booster. The primary-side standard transformer calibrator collects, through the standard current transformer, a signal the primary current outputted by the high-current generator. The primary-side standard transformer calibrator sends the signals of the primary voltage and the primary current to the industrial control machine.

In step E18, the industrial control machine collects, through the communication interface, the current signal and the voltage signal collected by the distribution terminal of the primary-secondary pole-mounted breaker, and calculates an error to complete the accuracy test on the integration.

In step E19, the industrial control machine controls the high-voltage power source to output the secondary voltage and the secondary current simultaneously, based on the preset waveform.

In step E20, the booster amplifies the secondary voltage outputted by the high-voltage power source to acquire the primary voltage, and the high-current generator amplifies the secondary current outputted by the high-voltage power source to acquire the primary current signal.

In step E21, The industrial computer collects, through the communication interface, the telecommand signal outputted by the distribution terminal, to complete a transmission test on the integration.

In step E22, the industrial control machine outputs the test report according to a result of the accuracy tests and the transmission tests, to complete a closed-loop test.

The aforementioned embodiments are only intended to describe the technical solutions of the present disclosure, and not to limit the present disclosure. Although the present disclosure is described in detail with reference to the above embodiments, those skilled in the art should understand that, modifications can be made to the technical solutions recorded in the above embodiments, or equivalent replacements can be made to some of the technical features thereof, and the modifications and the replacements will not make the corresponding technical solutions deviate from the spirit and the scope of the technical solutions of the embodiments of the present disclosure.

The invention claimed is:

1. A system for an integrated test on a primary-secondary pole-mounted breaker, comprising:
    a controller, wherein the controller is configured to:
        collect data, which relates to current, voltage, and power at a primary side and a secondary side of the primary-secondary pole-mounted breaker, from a standard transformer calibrator, a standard electricity-meter calibrator, and a distribution terminal of the primary-secondary pole-mounted breaker, through communication with the standard transformer calibrator, the standard electricity-meter calibrator, and the distribution terminal, respectively;
    a booster, configured to amplify a secondary voltage to acquire a primary voltage;
    a high-current generator, configured to amplify a secondary current to acquire a primary current;
    a standard voltage transformer, configured to convert the primary voltage into a voltage signal to facilitate measurement;
    a standard current transformer, configured to convert the secondary current into a current signal to facilitate measurement;
    the standard transformer calibrator, comprising a primary-side standard transformer calibrator, wherein the primary-side standard transformer is configured to collect a voltage signal and a current signal that are outputted to the primary side of the primary-secondary pole-mounted breaker; and
    the standard electricity-meter calibrator, configured to collect a reference power signal, and calculate a power error based on a signal of electric power collected by the distribution terminal of the primary-secondary pole-mounted breaker.

2. The system according to claim 1, wherein the controller is further configured to:
    pre-generate a state of a contact of a voltage regulator, wherein the state of the contact of the voltage regulator corresponding to each sequence of states, and
    restore an open or closing state of the primary-secondary pole-mounted breaker.

3. The system according to claim 1, further comprising:
    a first power source, configured to output the secondary voltage and the secondary current according to a preset parameter transmitted from the controller; and
    a relay protection tester, configured to output a sequence of states for the secondary voltage and a sequence of states for the secondary current according to anther preset parameter transmitted from the controller.

4. The system according to claim 1, further comprising a high-voltage power source, a low-voltage power source, and a route-switching apparatus, wherein:
    the standard transformer calibrator further comprises a secondary-side standard transformer calibrator;
    the high-voltage power source, configured to output the secondary voltage and the secondary current according to the preset parameter transmitted from the controller;
    the low-voltage power source is configured to output an electromagnetic terminal-voltage signal and an electromagnetic terminal-current signal, or output an electronic terminal-voltage signal and an electronic terminal-current signal, according to another preset parameter transmitted from the controller;
    the secondary-side standard transformer calibrator is configured to collect a voltage signal and a current signal that are outputted to the secondary side of the primary-secondary pole-mounted breaker; and
    the route-switching apparatus is configured to switch a loop in the integrated test, wherein:
        the route-switching apparatus connects an output of the secondary side of the breaker to the primary-side standard transformer calibrator, in case of a test on the primary side;
        the route-switching apparatus connects the low-voltage power source to the distribution terminal of the primary-secondary pole-mounted breaker, in case of a test on the secondary side; and
        the route-switching apparatus directly connects an output of the secondary side of the breaker to an input of the distribution terminal of the primary-secondary pole-mounted breaker, in case of a test on an integration of the primary side and the secondary side.

5. The system according to claim 4, wherein the route-switching apparatus is connected to the controller.

6. A method for an integrated test on a primary-secondary pole-mounted breaker, applied to the system according to claim 1, comprising:
    step S1, establishing an electrical connection between the system and the primary-secondary pole-mounted breaker;

step S2, establishing a communication connection between the system and the primary-secondary pole-mounted breaker;

step S3, comprising:
  applying, by the system, a voltage signal and a current signal to the primary-secondary pole-mounted breaker through the electrical connection, to generate a voltage and a current on the primary-secondary pole-mounted breaker;
  collecting, by the system, signals of the voltage and the current fed back from the primary-secondary pole-mounted breaker through the communication connection; and
  performing, by the system, an integrated accuracy test and an integrated protection test; and step S4, outputting a test result of the accuracy test and a test result of the integrated protection test to the controller.

7. The method according to claim 6, wherein the voltage and the current is applied on the primary-secondary pole-mounted breaker via a control terminal.

8. The method according to claim 6, wherein the step S3 comprises:
  step S31, comprising:
    applying, by the system, the voltage signal and the current signal to the primary-secondary pole-mounted breaker through the electrical connection, to generate the voltage and the current on the primary-secondary pole-mounted breaker; and
    collecting, by the system, the signals of the voltage and the current fed back from the primary-secondary pole-mounted breaker through the communication connection; and
    performing, by the system, the integrated accuracy test; and
  step S32, comprising:
    applying, by the system, a sequence of states for the current signal and a sequence of states for the voltage signal to the primary-secondary pole-mounted breaker through the electrical connection; and
    collecting, by the system, a switch action of the primary-secondary pole-mounted breaker to the controller through the communication connection; and
    performing, by the system, the integrated protection test.

9. The method according to claim 8, wherein the step S31 comprises:
  step A01: presetting a load point by the controller; controlling a voltage-loop voltage regulator to output the secondary voltage via a contact of the voltage-loop voltage regulator; and controlling a current-loop voltage regulator to output the secondary current via a contact of the current-loop voltage regulator;
  step A02: amplifying, by the booster, the secondary voltage to acquire a primary voltage; amplifying, by the high-current generator, the secondary current to acquire the primary current; collecting, by the controller, a signal of the primary current through the standard current transformer and the primary-side standard transformer calibrator; comparing, by the controller, the signal of the primary current with the preset load point; and controlling, by the controller, the current loop regulator to correct the secondary current, to obtain a stable primary current;
  step A03, converting, by the standard voltage transformer and the standard current transformer, the primary voltage and the primary stable current applied to an input side of the primary-secondary pole-mounted breaker into another secondary voltage and another secondary current;
  step A04: collecting, by the standard electricity-meter calibrator, first signals from the another secondary voltage and the another secondary current; and calculating electric power by the standard electricity-meter calibrator;
  step A05, collecting, by the primary-side standard transformer calibrator, second signals from the another secondary voltage and the another secondary current;
  step A06, obtaining, by the controller through a communication interface, the first signals, a signal of an active power, and the signal of electric power, which are collected by the distribution terminal of the primary-secondary pole-mounted breaker; and
  step A07, obtaining, by the controller through the communication interface, the second signals collected by the primary-side standard transformer calibrator.

10. The integrated detection method according to claim 8, wherein, step S32 comprises:
  step B01, ejecting, by the controller through a communication interface, a protection plate of a control terminal of the primary-secondary pole-mounted breaker;
  step B02, controlling, by the controller, a contact of a current-loop voltage regulator to pre-output a sequence of states for the secondary current, based on the preset sequence of states;
  step B03: amplifying, by the high-current generator, the secondary current to acquire the primary current; collecting, by the controller, a signal of the primary current through the standard current transformer and the primary-side standard transformer calibrator; comparing, by the controller, the primary current with a preset load point; and controlling, by the controller, the current-loop regulator to correct the secondary current to obtain a stable primary current;
  step B04, recording, by the controller, a state of the contact of the current-loop voltage regulator corresponding to each state in the sequence of states for the secondary current;
  step B05, injecting, by the controller through the communication interface, the protection plate of the control terminal of primary-secondary pole-mounted breaker;
  step B06, adjusting and outputting, by the controller, a sequence of states a secondary voltage and the sequence of states of a secondary current sequentially, according to the state of the contact of the current-loop voltage regulator corresponding to each state in the sequence of states for the secondary current;
  step B07, amplifying, by the booster, the sequence of states for the secondary voltage to acquire a sequence of states for the primary voltage; and amplifying, by the high-current generator, the adjusted sequence of states for the secondary current to acquire a sequence of states for the primary current;
  step B08, amplifying the secondary voltage to acquire the primary voltage;
  step B09, obtaining, by the controller through the electrical interface, a first signal of opening or closing of the primary-secondary pole-mounted breaker; and
  step B10: obtaining, by the controller through the communication interface, a second signal of opening or closing collected by the distribution terminal of the primary-secondary pole-mounted breaker; and controlling a state of opening or closing of the primary-secondary pole-mounted breaker based on the second signal of opening or closing.

11. A method for an integrated test on a primary-secondary pole-mounted breaker, applied to the system according to claim 3, comprising:
- step S1, establishing an electrical connection between the system and the primary-secondary pole-mounted breaker;
- step S2, establishing a communication connection between the system and the primary-secondary pole-mounted breaker;
- step S3, comprising:
  - applying, by the system, a voltage signal and a current signal to the primary-secondary pole-mounted breaker through the electrical connection, to generate a voltage and a current on the primary-secondary pole-mounted breaker; and
  - collecting, by the system, signals of the voltage and the current fed back from the primary-secondary pole-mounted breaker through the communication connection; and
  - performing, by the system, an integrated accuracy test and an integrated protection test; and
- step S4, outputting a test result of the accuracy test and a test result of the integrated protection test to the controller.

12. The method according to claim 11, wherein the step S3 comprises:
- step S31, comprising:
  - applying, by the system, the voltage signal and the current signal to the primary-secondary pole-mounted breaker through the electrical connection, to generate the voltage and the current on the primary-secondary pole-mounted breaker; and
  - collecting, by the system, signals of the voltage and the current fed back from the primary-secondary pole-mounted breaker through the communication connection; and
  - performing the integrated accuracy test; and
- step S32, comprising:
  - applying, by the system, a sequence of states for the current signal and a sequence of states for the voltage signal to the primary-secondary pole-mounted breaker through the electrical connection; and
  - collecting, by the system, a switch action of the primary-secondary pole-mounted breaker to the controller through the communication connection; and
  - performing the integrated protection test.

13. The integrated detection method according to claim 12, wherein the step S31 comprises:
- step C01, controlling, by the controller, the first power source to output the secondary voltage and the secondary current based on a preset load point;
- step C02, collecting, by a standard electricity-meter in the standard electricity-meter calibrator, a signal of the secondary current outputted by the first power source;
- step C03, collecting, by the primary-side standard transformer calibrator through the standard current transformer, another signal of the secondary current outputted by the first power source;
- step C04: amplifying, by the booster, the secondary voltage outputted by the first power source to acquire the primary voltage; and amplifying, by the high-current generator, the secondary current outputted by the first power source to acquire the primary current;
- step C05, collecting, by the primary-side standard transformer calibrator through the standard voltage transformer, a signal of the primary voltage outputted from the booster;
- step C06, collecting, by the standard electricity-meter in the standard electricity-meter calibrator through the standard voltage transformer, another signal of the primary voltage outputted from the booster;
- step C07, obtaining, by an error calculator in the standard electricity-meter calibrator, a signal of electric power collected by the standard electricity-meter, and the signal of electric power collected by the distribution terminal of the primary-secondary pole-mounted breaker through a communication interface; and calculating, by the error calculator, an error between the electric powers;
- step C08, obtaining, by the controller through the communication interface, the signal of the primary voltage and the another signal of the secondary current that are collected by the primary-side standard transformer calibrator;
- step C09, obtaining, by the controller through the communication interface, the error calculated by the standard electricity-meter calibrator; and
- step C10, obtaining, by the controller through the communication interface, a voltage signal and a current signal that are collected by the distribution terminal of the primary and second pole-mounted breaker.

14. The integrated detection method according to claim 12, wherein the step S32 comprises:
- step D01, controlling, by the controller, the relay protection tester to output the sequence of states for the secondary voltage and the sequence of states for the secondary current, based on the preset sequence of states;
- step D02, collecting, by the primary-side standard transformer calibrator through the standard current transformer, a signal of the secondary current outputted by the first power source;
- step D03: amplifying, by the booster, the sequence of states for the secondary voltage outputted by the relay protection tester to acquire a sequence of states for the primary voltage; and amplifying, by the high-current generator, the sequence of states for the secondary current outputted by the relay protection tester to acquire a sequence of states for the primary current;
- step D04, collecting, by the primary-side standard transformer calibrator through the standard voltage transformer, a signal of the primary voltage outputted from the booster;
- step D05, obtaining, by the controller through a communication interface, the signal of the primary voltage and the signal of the secondary current that are collected by the primary-side standard transformer calibrator; and
- step D06, obtaining, by the controller through the communication interface, a telecommand signal collected by the distribution terminal of the primary and second pole-mounted breaker.

15. A method for an integrated test on a primary-secondary pole-mounted breaker, applied to the system according to claim 4, comprising:
- step S1, establishing an electrical connection between the system and the primary-secondary pole-mounted breaker;
- step S2, establishing a communication connection between the system and the primary-secondary pole-mounted breaker;

step S3, comprising:
  applying, by the system, a voltage signal and a current signal to the primary-secondary pole-mounted breaker through the electrical connection, to generate a voltage and a current on the primary-secondary pole-mounted breaker; and
  collecting, by the system, signals of the voltage and the current fed back from the primary-secondary pole-mounted breaker through the communication connection; and
  performing, by the system, an integrated accuracy test and an integrated protection test; and
step S4, outputting a test result of the accuracy test and a test result of the integrated protection test to the controller.

16. The method according to claim 15, wherein the step S1 comprises:
  establishing a first electrical connection between a high-voltage output electrical interface of the system and the primary side of the primary-secondary pole-mounted breaker;
  establishing a second electrical connection between the route-switching apparatus of the system and the output of the secondary side of the primary-secondary pole-mounted breaker; and
  establishing a third electrical connection between the route-switching apparatus of the system and the distribution terminal of the primary-secondary pole-mounted breaker.

17. The method according to claim 15, wherein:
  the voltage signal and the current signal applied to the primary-secondary pole-mounted breaker are stable;
  the integrated accuracy test and the integrated protection test comprise an accuracy test on the primary side, the second side, and the integration of the primary side and the second side;
  the step S3 comprises:
    connecting, by the route-switching apparatus, the output of the secondary side of the breaker to the primary-side standard transformer calibrator, in case of the test on the primary side;
    connecting, by the route-switching apparatus, the low-voltage power source to the distribution terminal of the primary-secondary pole-mounted breaker, in case of the test on the secondary side; and
    connecting, by the route-switching apparatus, the output of the secondary side of the breaker directly to the input of the distribution terminal of the primary-secondary pole-mounted breaker, in case of the test on the integration of the primary side and the secondary side.

18. The method according to claim 17, wherein the step S3 comprises:
  step E01, establishing, by the controller through the route-switching apparatus, an electrical connection between the secondary side of the primary-secondary pole-mounted breaker and the primary-side standard transformer calibrator;
  step E02: controlling, by the controller, the high-voltage power source to output the secondary voltage and the secondary current simultaneously, based on a preset load point;
  step E03: amplifying, by the booster, the secondary voltage outputted by the high-voltage power source to acquire the primary voltage; and amplifying, by the high-current generator, the secondary current outputted by the high-voltage power source to acquire the primary current;
  step E04: collecting, by the primary-side standard transformer calibrator through the standard voltage transformer, a signal of the primary voltage outputted by the booster; and collecting, by the primary-side standard transformer calibrator through the standard current transformer, a signal of the primary current outputted by the high-current generator;
  step E05, collecting, by the primary-side standard transformer calibrator, signals of the secondary current and the secondary voltage that are outputted by the breaker;
  step E06: calculating, by the primary-side standard transformer calibrator, an error based on the collected signals; and sending, by the primary-side standard transformer calibrator, the error as a result to the controller, to complete the accuracy test on the primary side;
  step E07, establishing, by the controller, an electrical connection among the low-voltage power source, and the secondary-side standard transformer calibrator, and the distribution terminal of the primary-secondary pole-mounted breaker;
  step E08, controlling, by the controller, the low-voltage power source to output the secondary voltage and the secondary current simultaneously, based on the preset load point;
  step E09, collecting, by the secondary-side standard transformer calibrator, first signals of the secondary current and the secondary voltage outputted by the low-voltage power source; and
  sending, by the secondary-side standard transformer calibrator, the collected first signals of the secondary current and the secondary voltage to the controller;
  step E10: collecting, by the standard electricity-meter calibrator, second signals of the secondary current signal and the secondary voltage signal outputted by the low-voltage power source; and sending another signal of electric power to the controller;
  step E11: collecting, by the controller through a communication interface to the distribution terminal of the primary-secondary pole-mounted breaker, a current signal, a voltage signal and the signal of electric power that are collected by the distribution terminal; and comparing, by the controller, the current signal, the voltage signal and the signal of the electric power that are collected by the distribution terminal, with the first signals sent by the secondary-side standard transformer calibrator and the another signal of electric power sent by the standard electricity-meter calibrator, to calculate an error and complete the accuracy test on the secondary side;
  step E12, controlling, by the controller, the low-voltage power source to output the secondary signal and the secondary current simultaneously, based on a preset waveform;
  step E13, collecting, by the controller through the communication interface, a telecommand signal outputted by the distribution terminal of the primary-secondary pole-mounted breaker, to complete a transmission test on the secondary side;
  step E14, establishing, by the industrial computer through the route-switching apparatus, an electrical connection between the primary-secondary pole-mounted breaker and the distribution terminal of the primary-secondary pole-mounted breaker;

step E15, controlling, by the controller, the high-voltage power source to output the secondary voltage and the secondary current simultaneously, based on another preset load point;

step E16, amplifying, by the booster, the secondary voltage outputted by the high-voltage power source to acquire the primary voltage; and amplifying, by the high-current generator, the secondary current outputted by the high-voltage power source to acquire the primary current;

step E17: collecting, by the primary-side standard transformer calibrator through the standard voltage transformer, a signal of the primary voltage outputted by the booster; collecting, by the primary-side standard transformer calibrator through the standard current transformer, a signal of the primary current outputted by the high-current generator; and sending, by the primary-side standard transformer calibrator, the signals of the primary voltage and the primary current to the controller;

step E18: collecting, by the controller through the communication interface, the current signal and the voltage signal collected by the distribution terminal of the primary-secondary pole-mounted breaker; and calculating, by the controller, an error to complete the accuracy test on the integration;

step E19: controlling, by the controller, the high-voltage power source to output the secondary voltage and the secondary current simultaneously, based on the preset waveform;

step E20: amplifying, by the booster, the secondary voltage outputted by the high-voltage power source to acquire the primary voltage; and amplifying, by the high-current generator, the secondary current outputted by the high-voltage power source to acquire the primary current signal;

step E21: collecting, by the industrial computer through the communication interface, the telecommand signal outputted by the distribution terminal, to complete a transmission test on the integration; and step E22: outputting, by the controller, a result of the accuracy tests and the transmission tests, to complete a closed-loop test.

\* \* \* \* \*